(12) United States Patent
Karg et al.

(10) Patent No.: US 11,315,634 B1
(45) Date of Patent: Apr. 26, 2022

(54) DEVICE COMPRISING TUNABLE RESISTIVE ELEMENTS

(71) Applicant: International Business Machines Corporation, Armonk, NY (US)

(72) Inventors: Siegfried Friedrich Karg, Adliswil (CH); Gerhard Ingmar Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/074,763

(22) Filed: Oct. 20, 2020

(51) Int. Cl.
*G11C 13/00* (2006.01)

(52) U.S. Cl.
CPC ........ *G11C 13/0069* (2013.01); *G11C 13/004* (2013.01); *G11C 13/0007* (2013.01); *G11C 13/0097* (2013.01)

(58) Field of Classification Search
CPC ............ G11C 13/0069; G11C 13/0007; G11C 13/0097; G11C 13/004
See application file for complete search history.

(56) References Cited

U.S. PATENT DOCUMENTS

| | | | |
|---|---|---|---|
| 9,183,929 B2 | 11/2015 | Fantini et al. | |
| 9,552,878 B2 | 1/2017 | Yoon et al. | |
| 9,959,928 B1 | 5/2018 | Hsu et al. | |
| 2006/0221734 A1* | 10/2006 | Bedeschi | G11C 7/062 365/201 |
| 2008/0106929 A1* | 5/2008 | Meyer | G11C 13/0069 365/153 |
| 2008/0273371 A1* | 11/2008 | Philipp | G11C 13/0061 365/148 |
| 2010/0157651 A1 | 6/2010 | Kumar et al. | |
| 2010/0232207 A1 | 9/2010 | Maejima et al. | |
| 2013/0107605 A1* | 5/2013 | Chen | G11C 13/0007 365/148 |

(Continued)

FOREIGN PATENT DOCUMENTS

| | | |
|---|---|---|
| CN | 101958146 B | 11/2012 |
| CN | 102915762 A | 2/2013 |

OTHER PUBLICATIONS

Karg et al. "Transition-metal-oxide-based resistance-change memories," IBM J. Res. & Dev. 52, No. 4/5, Jul./Sep. 2008, pp. 481-492.

(Continued)

*Primary Examiner* — Khamdan N. Alrobaie
(74) *Attorney, Agent, or Firm* — Kelli D. Morin

(57) ABSTRACT

A device includes at least one tunable resistive element. Each tunable resistive element comprises a first terminal, a second terminal, and a dielectric layer arranged between the first and second terminals. The device is configured to apply at least one electrical set pulse to the resistive elements to form a conductive filament comprising a plurality of oxygen vacancies in the dielectric layer. The device is configured to apply at least one electrical reset pulse to displace a subset of the oxygen vacancies of the conductive filament. The at least one electrical reset pulse comprises a first part, which is adapted to increase the temperature of the conductive filament and increase the mobility of the oxygen vacancies of the conductive filament, and a second part, which is configured to displace the subset of the oxygen vacancies of the conductive filament.

20 Claims, 7 Drawing Sheets

(56) References Cited

U.S. PATENT DOCUMENTS

2014/0056053 A1\* 2/2014 Ramaswamy ..... G11C 13/0002
365/148
2015/0380086 A1\* 12/2015 Park ................... G11C 13/0011
365/148

OTHER PUBLICATIONS

Meijer, G.I., "Who Wins the Nonvolatile Memory Race?" Science, vol. 319, 3 pgs., Mar. 21, 2008.
Milo et al., "Low-energy inference machine with multilevel HfO2 RRAM arrays," IEEE European Solid-State Device Research Conference (ESSDERC) 2019, 4 pgs.
Milo et al., "Multilevel HfO2-based RRAM Devices for Low-Power Neuromorphic Networks," https://aip.scitation.org/doi/full/10.1063/1.5108650, APL Materials, vol. 7, Issue 8, 2019, 11 pgs.
Petzold et al., "Gradual Reset and Set Characteristics in Yttrium Oxide Based Resistive Random Access Memory," https://iopscience.iop.org/article/10.1088/1361-6641/ab220f, Journal of Semiconductor Science and Technology, vol. 34, No. 7, 2019, 7 pgs.
International Search Report and Written Opinion, Application No. PCT/IB2021/059115, dated Jan. 10, 2022, 6 pgs.

\* cited by examiner

RESET 1
(HRS 1)

SET1 1
(LRS 1)

SET 2
(LRS 2)

SET 3
(LRS 3)

DEVICE COMPRISING TUNABLE RESISTIVE ELEMENTS

BACKGROUND

The present disclosure is notably directed to a device comprising one or more tunable resistive elements. The present disclosure further concerns a method for programming tunable resistive elements, a neuromorphic network, and computer program product for operating a device comprising one or more tunable resistive elements.

Nanoscale memory devices, whose resistance depends on the history of the electric signals applied, have the potential to become critical building blocks in new computing paradigms, such as brain-inspired computing and memcomputing. One of the leading solutions is Resistive RAM (RRAM). It involves creating filaments of, for example, oxygen vacancies in dielectrics such as HfO2, using a process called soft breakdown. The filaments are subsequently closed (SET) or opened (RESET) during operation. Strongly reducing metals, for example titanium, may be used as one of the electrodes to enhance the formation of the filament.

SUMMARY

Embodiments of the present disclosure include a method for programming tunable resistive elements, a neuromorphic network, and computer program product for operating a device comprising one or more tunable resistive elements.

According to some embodiments of the present disclosure, a device comprises one or more tunable resistive elements. The tunable resistive elements comprise a first terminal, a second terminal, and a dielectric layer arranged between the first terminal and the second terminal. The device is configured to apply one or more electrical set pulses to the one or more resistive elements to form a conductive filament comprising a plurality of oxygen vacancies in the dielectric layer and to apply one or more electrical reset pulses to displace a subset of the oxygen vacancies of the conductive filament. The electrical reset pulses comprise a first part, which is adapted to increase the temperature of the conductive filament and the mobility of the oxygen vacancies of the conductive filament, and a second part, which is configured to displace the subset of the oxygen vacancies of the conductive filament.

According to another embodiment of the present disclosure, a method is used to program tunable resistive elements. The tunable resistive elements comprise a first terminal, a second terminal, and a dielectric layer between the first terminal and the second terminal. The method comprises applying one or more electrical set pulses to the one or more resistive elements to form a conductive filament comprising a plurality of oxygen vacancies in the dielectric layer and applying one or more electrical reset pulses to displace a subset of the oxygen vacancies of the conductive filament. The electrical reset pulses comprise a first part which is adapted to increase the temperature of the conductive filament and the mobility of the oxygen vacancies of the conductive filament. The electrical reset pulses further comprise a second part being configured to displace the subset of the oxygen vacancies of the conductive filament.

According to another embodiment of the present disclosure, a computer program product is used to operate a device comprising one or more tunable resistive elements. The tunable resistive elements comprise a first terminal, a second terminal, and a dielectric layer arranged between the first terminal and the second terminal. The computer program product comprises a computer readable storage medium having program instructions embodied therewith. The program instructions are executable by a control unit of the device to cause the control unit to perform a method comprising steps of applying one or more electrical set pulses to the one or more resistive elements to form a conductive filament comprising a plurality of oxygen vacancies in the dielectric layer and applying one or more electrical reset pulses to displace a subset of the oxygen vacancies of the conductive filament. The electrical reset pulses comprise a first part, which is adapted to increase the temperature of the conductive filament and the mobility of the oxygen vacancies of the conductive filament, and a second part, which is configured to displace the subset of the oxygen vacancies of the conductive filament.

Embodiments of the present disclosure are described in more detail below, by way of illustrative and non-limiting examples, with reference to the accompanying drawings.

BRIEF DESCRIPTION OF THE DRAWINGS

Throughout the drawings, same or similar reference numerals represent the same or similar elements.

Figure 1:
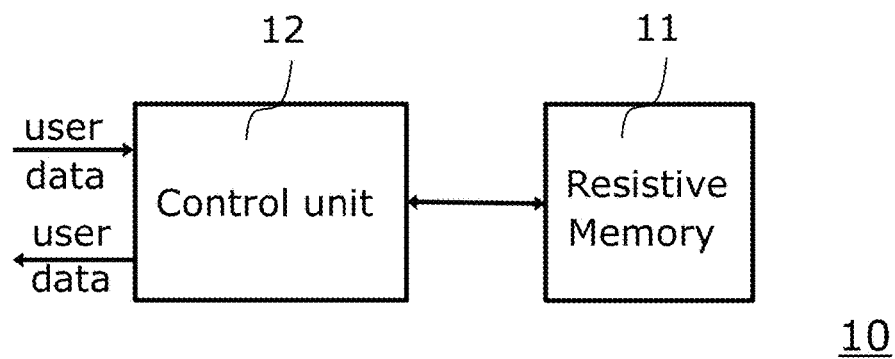
FIG. 1 depicts a block diagram of a device according to some embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the present disclosure.

DETAILED DESCRIPTION

Aspects of the present disclosure relate generally to the field of computing, and in particular to a device comprising one or more tunable resistive elements. While the present disclosure is not necessarily limited to such applications, various aspects of the disclosure may be appreciated through a discussion of various examples using this context.

While it has been shown that setting the low-resistance state may be well controlled using the current compliance of the set signal, resetting the cell to higher resistance is far less flexible. More particularly, only resetting to one high-resistance state (HRS) is usually feasible. Accordingly, there is a need for further improvements of resistive elements and associated devices.

With reference to FIGS. 1-10, some general aspects and terms of embodiments of the present disclosure are described.

According to some embodiments of the present disclosure, a resistive material may be defined as a material having an electrical resistance which can be changed by application of an electrical signal thereto. The electrical signal may be, for example, an electrical current flowing through the device or an electrical voltage applied to the resistive material. The current and/or voltage may be, for example, applied to the resistive element in the form of pulses. As a result, the electrical resistance of a resistive element depends on the history of the electric signal that has been applied to the resistive memory element.

Resistive materials may be, in particular, used as memory elements. Accordingly, resistive memory elements are based on a physical phenomenon occurring in a material that changes its resistance under application of a current or electric field. The change is usually non-volatile and reversible. Several classes of resistive memory elements are known, ranging from metal-oxides to chalcogenides. Typical resistive memory elements are metal/insulator/metal structures in which the metallic components serve as the electrodes and the insulator is a resistive switching material. These resistive memory elements exhibit good performance in terms of power consumption, integration density potential, retention, and endurance.

One particularly promising example for resistive memory devices is resistive random-access memories (RRAM). This is a non-volatile memory technology in which the fundamental storage unit (the "cell") comprises a RRAM material located between a pair of electrodes. The RRAM material in these cells is an electrically-insulating matrix which normally presents a high resistance to electric current. Due to properties of the RRAM matrix or of the combination of matrix and electrode materials, however, a particular property of RRAM cells is that an electrically-conductive path can be formed within the high-resistance matrix by applying a suitable electrical signal, in particular a voltage, to the electrodes. This conductive path extends through the matrix in a direction between the electrodes. The conductive path can be broken or eliminated by applying another "RESET" signal to the electrodes, which returns the cell to the high-resistance RESET state. Thus, by appropriate applications of SET and RESET pulses in one or more data write operations, individual cells can be programmed into states with measurably-different resistance values. The programmed cell state can be determined in a read operation using cell resistance as a metric for cell state. Upon the application of a read voltage to the electrodes, the current which flows through the cell depends on the cell's resistance, whereby cell current can be measured to determine the cell state. The read voltage is typically significantly lower than the write voltage used for programming so that the read operation does not disturb the programmed cell state.

While generally the conductive path can be formed by any of a number of different mechanisms in RRAM cells, embodiments of the present disclosure use, in particular, conductive path formation by oxygen vacancies resulting from migration of oxygen ions in the insulating matrix.

The term "set pulse" shall generally refer to a pulse, or more generally an electrical signal, which decreases the electrical resistance of the resistive element, in particular by forming a filament of oxygen vacancies between electrodes/terminals of a resistive element.

The term "reset pulse" shall generally refer to a pulse, or more generally an electrical signal, which increases the electrical resistance of the resistive element, in particular by reducing the size or resistivity of the conductive filament.

The term "reset resistance state of a resistive element" shall generally refer to a resistance state after the application of one or more reset pulses. A reset resistance state may also be generally denoted as high resistance state (HRS).

The term "set resistance state of a resistive element" shall generally refer to a resistance state after the application of one or more set pulses. A set resistance state may be generally denoted also as low resistance state (LRS).

According to embodiments of the present disclosure, a reset pulse has a different polarity than a set pulse.

FIG. 1 depicts a simplified schematic block diagram of a resistive device 10. In at least some embodiments of the present disclosure, the resistive device 10 may be a resistive memory device 10. The memory device 10 includes a multilevel resistive memory 11 for storing data in one or more integrated arrays of resistive memory elements described below. Reading and writing of data to memory 11 is performed by a control unit 12. The control unit 12 comprises circuitry of generally known form for programming resistive memory elements during data write operations and making read measurements for detecting element-state during data read operations. During these operations, the control unit 12 can address individual resistive memory elements by applying appropriate control signals to an array of word and bit lines in the resistive memory 11. User data input to the device 10 may be subjected to some form of write-processing, such as coding for error-correction purposes, before being supplied as write signal, in particular as write voltage, to the resistive memory 11. Similarly, read signals received from the resistive memory 11 may be processed by a read-processing module of the control unit 12, for example for code-word detection and/or error correction, to recover the original input user data.

Figure 2:
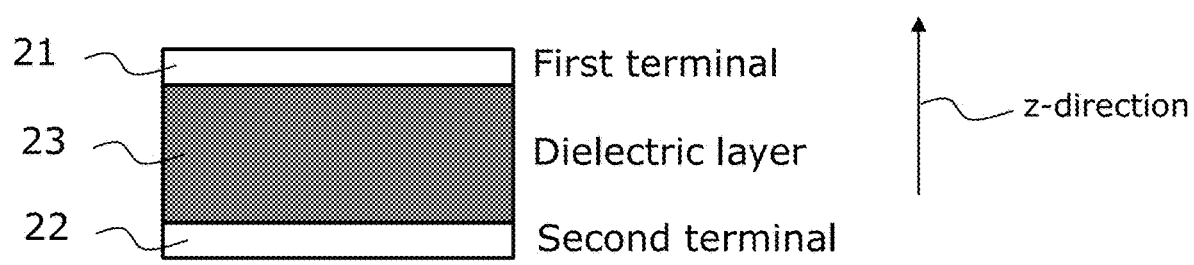
FIG. 2 depicts a schematic cross-sectional view of a tunable resistive element according to some embodiments of the present disclosure.

FIG. 2 depicts a simplified cross-sectional view of a tunable resistive element 20 according to at least one embodiment of the present disclosure. The tunable resistive element 20 comprises a first terminal 21, a second terminal 22, and a dielectric layer 23. The dielectric layer 23 may comprise a metal-oxide material. The metal-oxide material may be, in particular, a transition metal-oxide. According to at least one embodiment, the transition metal-oxide may be $ABO_{3-\delta}$ perovskites, A being an alkaline earth element, a rare earth element, or a combination thereof, and B being a transition-metal element. Examples are lanthanum and/or strontium titanium oxide $(La,Sr)TiO_{3-\delta}$, yttrium and/or calcium titanium oxide $(Y,Ca)TiO_{3-\delta}$, lanthanum and/or strontium manganese oxide $(La,Sr)MnO_{3-\delta}$, or praseodymium and/or calcium manganese oxide $(Pr,Ca)MnO_{3-\delta}$. Further transition metal-oxides that may be advantageously used for embodiments of the present disclosure include corundum such as vanadium and/or chromium oxide $(V,Cr)_2O_{3-\delta}$. Other materials that can be used advantageously include binary transition metal-oxides such as nickel oxide $NiO_{1-\delta}$, titanium oxide $TiO_{2-\delta}$, hafnium and/or zirconium oxide $(Hf,Zr)O_{2-\delta}$, and cerium oxide $CeO_{2-\delta}$. Preferably, the metal-oxide material is a material having a comparably high mobility of oxygen vacancies, for example, $10^{-9}$ cm$^2$Ns or higher at room temperature.

The first terminal 21 and the second terminal 22 may comprise or may consist of a metal, a metal-oxide, or conductive or amorphous carbon. The first terminal 21 and the second terminal 22 metal may comprise or may consist of Ti, TiN, Ta, TaN, W, Cu, Pt, any metallic oxide such as WO3, RuO2, and ITO, or amorphous C. The dielectric layer 23 may be preferably embodied with a thickness in the z-direction between 1 nm and 50 nm.

The dielectric layer 23 is configured to form conductive filaments of oxygen vacancies upon the application of an electrical programming signal, for example, an electrical current or an electrical voltage.

According to some embodiments of the present disclosure, a plurality of the resistive elements 20 may be implemented in the resistive memory 11, and the control unit 12 of the memory device 10 may be configured to apply in a write mode one or more write signals, in particular write voltages, to the first terminal 21 and the second terminal 22 for writing a resistance state. In addition, the control unit 12 may apply in a read mode a read signal, in particular a read voltage, to the first terminal 21 and the second terminal 22 for reading the resistance state.

The write signals may be embodied, in particular, as electrical set pulses and electrical reset pulses. By applying the electrical set pulses to the resistive elements, one or more conductive filaments of oxygen vacancies can be formed in the dielectric layer 23. This results in a decrease of the electrical resistance of the resistive element 20. Furthermore, by applying one or more electrical reset pulses to the resistive elements 20, a subset of the oxygen vacancies of the conductive filaments may be moved, or in other words displaced, to reduce the size or resistivity of the conductive filament, thereby increasing the resistivity of the resistive element 20.

According to at least some embodiments of the present disclosure, the control unit 12 may program the resistance state of the resistive elements 20, in particular by an iterative program and verify procedure.

The programming of the resistance state of the resistive elements 20 is explained in more detail with reference to FIGS. 3A-3G.

Figure 3A:
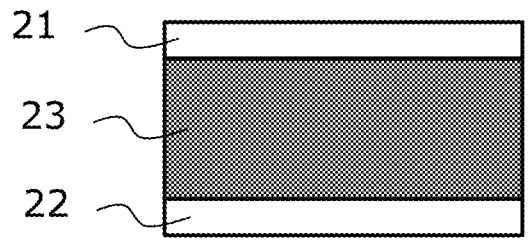
FIG. 3A depicts a schematic cross-sectional view of a tunable resistive element in a first reset-resistance state according to some embodiments of the present disclosure.

FIG. 3A depicts a schematic cross-sectional view of the tunable resistive element 20 in a first reset resistance state RESET 1. In the first reset-resistance state RESET 1, there is no conductive filament of oxygen vacancies between the first terminal 21 and the second terminal 22, or a former conductive filament is at least disrupted (as shown in FIG. 3G).

The first reset resistance state RESET 1 may be considered to be an initial state of the resistive element 20, meaning the state before any electrical field or any electrical programming pulses have been applied to the resistive element 20. Furthermore, the first reset resistance state RESET 1 can be reached by applying one or more electrical reset pulses to the resistive element 20. These electrical reset pulses may bring the resistive element 20 back to its original state.

The first reset resistance state may also refer to a complete or full reset state, indicating that there is not a filament/path of oxygen vacancies between the first terminal 21 and the second terminal 22.

Figure 3B:
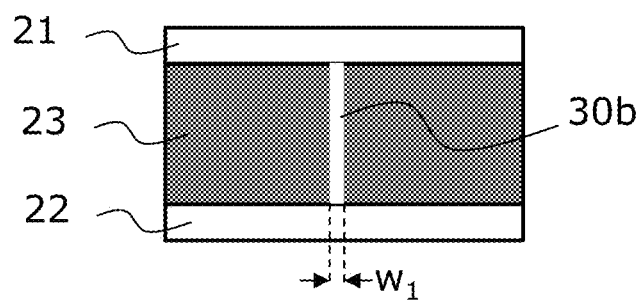
FIG. 3B depicts a schematic cross-sectional view of a tunable resistive element in a first set resistance state according to some embodiments of the present disclosure.

FIG. 3B shows a schematic cross-sectional view of the tunable resistive element 20 in first set resistance state SET 1. The first set resistance SET 1 may be reached by applying one or more set pulses. The one or more set pulses create a filament 30b of oxygen vacancies in the dielectric layer 23 between the first terminal 21 and the second terminal 22. The corresponding process for creating the conductive filament 30b is referred to as soft breakdown.

While in FIGS. 3B to 3G only a single conductive filament 30b-g (generically referred to as a conductive filament 30) is shown, it should be noted that the set pulses may also create a plurality of parallel conductive filaments of oxygen vacancies, depending on the respective device/cell geometry.

The filament 30b shown in FIG. 3B is relatively small as illustrated with an exemplary width w1.

Figure 3C:
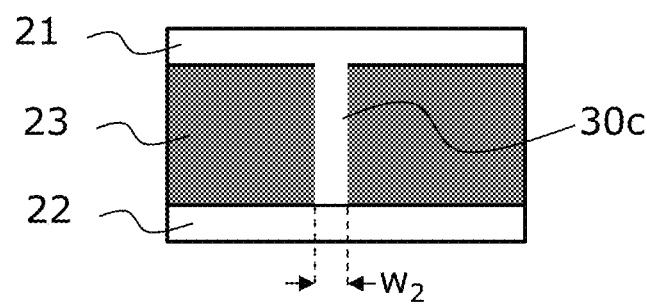
FIG. 3C depicts a schematic cross-sectional view of a tunable resistive element in a second set resistance state according to some embodiments of the present disclosure.

FIG. 3C shows a schematic cross-sectional view of a tunable resistive element in a second set resistance state SET 2. The second set resistance state SET 2 may be reached, starting from the first set resistance state SET 1, by applying one or more set pulses to the first terminal 21 and the second terminal 22. Compared with the conductive filament 30b of the first set resistance state SET 1 (illustrated in FIG. 3B), the conductive filament 30c of the second set resistance state SET 2 is larger. More specifically, the conductive filament 30c in the second set resistance state comprises a higher number of oxygen vacancies than the conductive filament 30b in the first set resistance state. This may result, in particular, in a larger width and larger cross section of the conductive filament 30c in the second set resistance state. This is illustrated with an exemplary width w2.

Figure 3D:
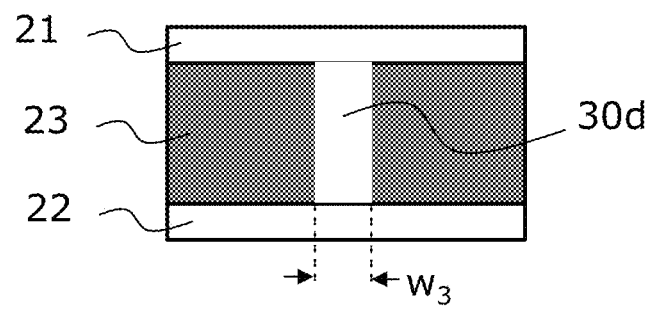
FIG. 3D depicts a schematic cross-sectional view of a tunable resistive element in a third set resistance state according to some embodiments of the present disclosure.

FIG. 3D shows a schematic cross-sectional view of a tunable resistive element in a third set resistance state SET 3. The third set resistance state SET 3 may be reached, starting from the second set resistance state SET 2, by applying one or more set pulses to the first terminal 21 and the second terminal 22. Compared with the conductive filament 30c of the second set resistance state SET 2 (illustrated in FIG. 3C), the conductive filament 30d is larger. More specifically, the conductive filament 30d in the third set resistance state comprises a higher number of oxygen vacancies than the conductive filament 30c in the second set resistance state. This may result, in particular, in a larger width and larger cross section of the conductive filament 30d in the third set resistance state. This is illustrated with an exemplary width w3.

Figure 3E:
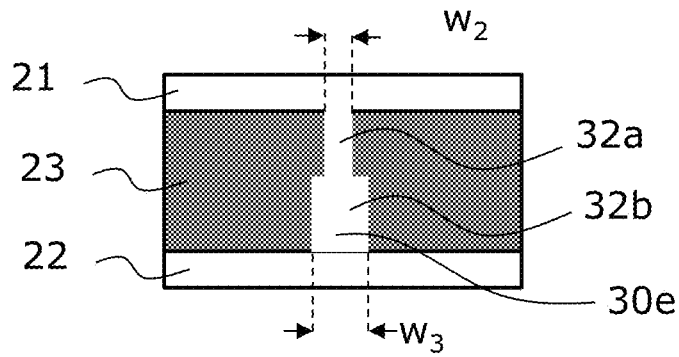
FIG. 3E depicts a schematic cross-sectional view of a tunable resistive element in a second reset resistance state according to some embodiments of the present disclosure.

Referring now to FIG. 3E, a second reset resistance state RESET 2 is shown. The second reset resistance state RESET 2 may be reached, starting from the third set resistance state SET 3, by applying one or more reset pulses. The reset pulses generally displace a subset of the oxygen vacancies of the conductive filament 30e. Such a displacement of the oxygen vacancies generally reduces the size of the filament 30e. In other words, the displacement of the oxygen vacancies makes the filament 30e smaller and/or less conductive. In particular, the reset pulses are configured according to embodiments of the present disclosure to trigger an oxygen vacancy drift away from the first terminal 21. In other words, the reset pulses displace or move the oxygen vacancies which are close to the first terminal 21. More generally, the reset pulses are configured according to embodiments of the present disclosure to trigger an oxygen-vacancy drift away from the electrode that acts as anode.

Accordingly, the displacement of the oxygen vacancies by the reset pulses reduces the size of the filament 30e specifically in the proximity of the first terminal 21. This is illustrated in FIG. 3E in a simplified and exemplary way by a filament 30e which has a segment 32a of smaller size in the proximity of the first terminal 21 and a segment 32b of larger size in the proximity of the second terminal 22. According to embodiments, the segment 32a of the filament 30e may have in the second reset resistance state RESET 2 a width w2 corresponding to the width w2 of the filament 30c in the second set resistance state SET 2 and the segment 32b of the filament may have in the second reset resistance state RESET 2 a width w3 corresponding to the width w3 of the filament 30d in the third set resistance state SET 3. Of course, as already mentioned above, the segments 32a and 32b are illustrated in a simplified manner for the purpose of explaining the general operation of tunable resistive elements according to embodiments of the present disclosure.

The nominal resistance value of the second reset resistance state RESET 2 may correspond or may be close to the nominal resistance value of the second set resistance state SET 2.

Figure 3F:
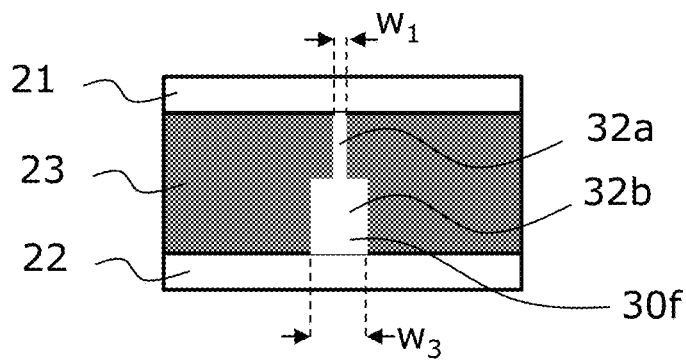
FIG. 3F depicts a schematic cross-sectional view of a tunable resistive element in a third reset resistance state according to some embodiments of the present disclosure.
Figure 3G:
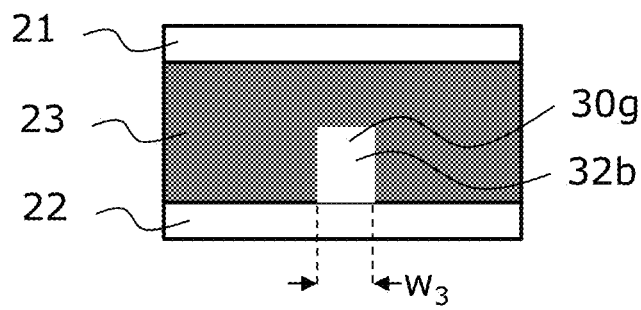
FIG. 3G depicts a tunable resistive element which is in the first reset resistance state according to some embodiments of the present disclosure.

Referring now to FIG. 3F, a third reset resistance state RESET 3 is shown. The third reset resistance state RESET 3 may be reached, starting from the second reset resistance state RESET 2, by applying one or more reset pulses. The reset pulses are configured according to embodiments of the present disclosure to trigger a further oxygen vacancy drift away from the first terminal 21. Accordingly, the reset pulses further reduce the size of the filament 30f in the proximity of the first terminal 21.

This is illustrated in FIG. 3F in a simplified and exemplary way by filament 30f. In the third reset resistance state RESET 3, the filament 30f has a segment 32a, which has a width w1 corresponding to the width w1 of the filament 30b in the first set resistance state SET 1, and a segment 32b, which has a width w3 corresponding to the width w3 of the filament 30d in the third set resistance state SET 3. Accordingly, the nominal resistance value of the third reset resistance state RESET 3 may correspond or may be close to the nominal resistance value of the first set resistance state SET 1.

Referring now the FIG. 3G, a tunable resistive element is shown which is again in the first (full) reset resistance state RESET 1. The first reset resistance state RESET 1 may be reached, starting from the third reset resistance state RESET 3, by applying one or more reset pulses. The reset pulses are configured according to embodiments of the present disclosure to trigger a further oxygen vacancy drift away from the first terminal 21. Accordingly, the reset pulses further reduce the size of the filament in the proximity of the first terminal 21. More particularly, the additional reset pulse(s) have opened, or in other words interrupted, the filament 30g in the area adjacent or near to the first terminal 21. Therefore, there is no longer a complete conductive filament between the first terminal 21 and the second terminal 22. While a segment 32b of the filament 30g may remain in the area adjacent or near to the second terminal 22, the rupture of the filament 30g may correspond to a significant increase of the nominal resistance of the resistive element 20. Accordingly, the nominal resistance states of the resistive element 20 illustrated in FIG. 3A and the resistive element 20 illustrated in FIG. 3G may be substantially similar to each other, and thus both are commonly referred to as first reset resistance state RESET 1.

According to embodiments of the present disclosure, the reset resistance states RESET 1, RESET 2 and RESET 3 may also be referred to as high resistance states HRS 1, HRS 2 and FIRS 3, respectively.

According to embodiments of the present disclosure, the set resistance states SET 1, SET 2 and SET 3 may also be referred to as low resistance states LRS 1, LRS 2 and LRS 3, respectively. In this respect, the term "high resistance state" shall indicate that the state has been reached after the application of a reset signal/reset pulse, while the term "low resistance state" shall indicate that the state has been reached after the application of a set signal/set pulse.

Figure 4:
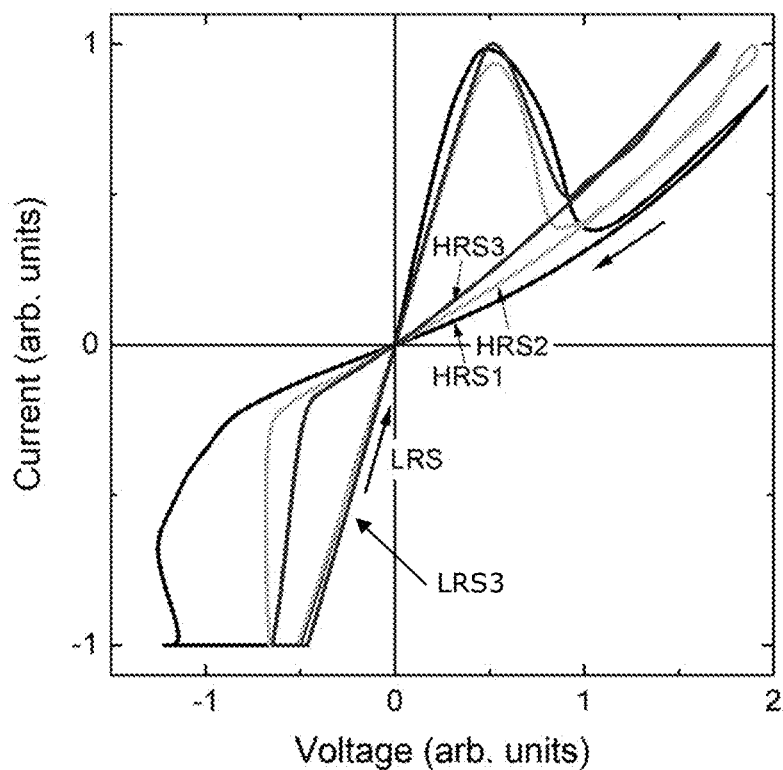
FIG. 4 depicts the current-voltage characteristic of a tunable resistive element according to some embodiments of the present disclosure.

FIG. 4 depicts the current-voltage characteristic of a tunable resistive element according to embodiments of the present disclosure. In particular, FIG. 4 illustrates the feasibility of obtaining multiple high-resistance states. Using reset signals/reset pulses, three different reset resistance states/high resistance states FIRS 1, HRS 2 and FIRS 3 can be programmed. Furthermore, a single type of set pulse (with the current compliance adjusted to 1 in the units of FIG. 4) has been used, resulting in a set resistance state/low resistance state LRS 3. The nominal value of the reset resistance states may partially correspond to the nominal value of the set resistance states as mentioned above.

Figure 5:
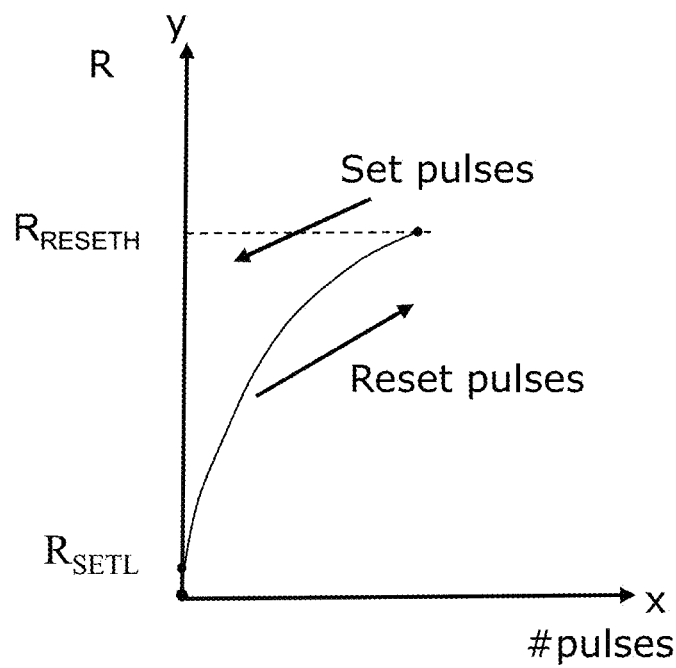
FIG. 5 depicts an illustrative example of a resistance curve of resistive elements according to some embodiments of the present disclosure.

FIG. 5 depicts an example of a resistance curve of resistive elements according to embodiments of the present disclosure. The y-axis indicates the resistance, and the x-axis indicates the number of set pulses or reset pulses applied to the resistive element. The resistance of the resistive element can be changed between a lowest one $R_{SETL}$ of a plurality of set resistance states and the highest one $R_{RESET}$ of a plurality of reset resistance states. Referring to the example as illustrated in FIGS. 3A to 3G, the corresponding tunable resistive element may be changed between $R_{SET3}$, as lowest set resistance state, and $R_{RESET1}$, as highest reset resistance state.

By applying reset pulses, the resistance can be increased. Conversely, by applying set pulses, the resistance can be decreased. In this respect, embodiments of the present disclosure may provide a non-hysteretic behavior of the resistive elements which facilitates a bidirectional programming of resistance values of the resistive elements. In other words, according to embodiments of the present disclosure, the resistive element provides a substantially symmetric bidirectional resistance curve upon application of set pulses and reset pulses. Accordingly, embodiments of the present disclosure may provide a continuously tunable resistor as two terminal device.

Figure 6:
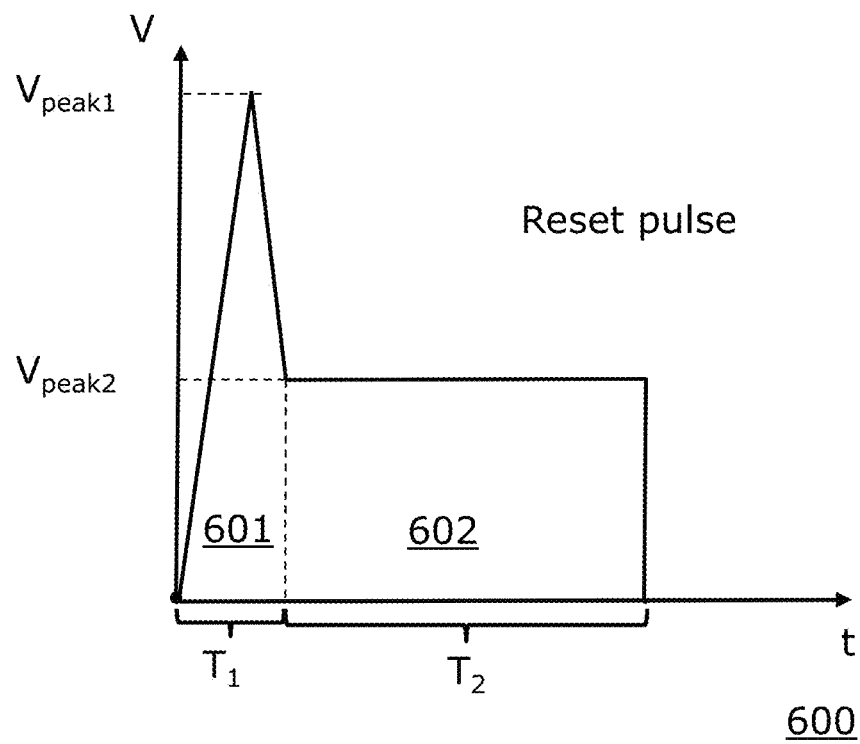
FIG. 6 depicts an illustrative reset pulse according to some embodiments of the present disclosure.

FIG. 6 depicts an example reset pulse 600 according to at least one embodiment of the present disclosure. The horizontal axis indicates the time t in arbitrary units, and the vertical axis indicates the voltage V of the reset pulse 600 in arbitrary units. The reset pulse 600 is shaped to decouple the effects of temperature increase and electrical field induced ion drift. The reset pulse 600 comprises a first part 601, or in other words a first signal segment 601, which extends over a first duration $T_1$, and a second part 602, or in other words a second signal segment 602, which extends over a second duration $T_2$.

The first part 601 is adapted to increase the temperature of the conductive filament 30 (such as that shown in FIGS. 3B-3G) and to increase the mobility of the oxygen vacancies of the conductive filament 30. The second part 602 is configured to displace a subset of the oxygen vacancies of the conductive filament 30. More specifically, the second part 602 is configured to move the oxygen vacancies away from the terminal which acts as anode. The reset pulse 600 is shaped such that multiple reset resistance states can be programmed, and an incremental increase of the resistance can be accomplished directly without a full reset.

The first part 601 of the electrical reset pulse 600 has a first peak amplitude $V_{peak1}$ and the second part 602 of the electrical reset pulse 600 has a second peak amplitude $V_{peak2}$. The first peak amplitude $V_{peak1}$ is greater than the second peak amplitude $V_{peak2}$ and the first duration $T_1$ is shorter than the second duration $T_2$.

The first part 601 generally consists of a larger amplitude, shorter duration signal. This signal segment leads to an increase of the temperature in/around the conducting filament 30. This causes the oxygen vacancy mobility in this region to increase. The duration of this first signal segment 601 however is chosen to be so short that oxygen vacancies essentially have no time to drift and, therefore, essentially remain in place.

The second part 602 consists of a smaller amplitude, longer duration signal. This signal segment leads to a drift of the oxygen vacancies.

Resistive elements according to embodiments of the present disclosure utilize that the elevated temperature in/around the conductive filament 30 caused by the first signal segment 601 remains for some time duration past said first signal segment. This may be in particular established by a low thermal conductivity of the materials of the resistive elements. Accordingly, the temperature, and concomitantly the oxygen vacancy mobility in/around the conducting filament 30, remains high during the second signal segment 602.

The smaller amplitude, and concomitantly slower oxygen vacancy drift velocity, of the second signal segment 602, as well as the longer duration, then allows a well-controlled displacement of oxygen vacancies. As a result, the resistance state of the resistive elements can be incrementally decreased by set pulses and incrementally increased by reset pulses. In other words, the resistive state of the resistive elements can be modified in a well-controlled way.

Resistive elements according to embodiments of the present disclosure may provide a higher endurance than conventional RRAM, which require a complete reset to obtain an incremental increase of the resistance of the RRAM cell.

According to at least one embodiment of the present disclosure, the first peak amplitude $V_{peak1}$ is at least two times greater than the second peak amplitude $V_{peak2}$. According to at least one embodiment of the present disclosure, the first peak amplitude $V_{peak1}$ is at least three times greater than the second peak amplitude $V_{peak2}$. According to at least one embodiment of the present disclosure, the first peak amplitude $V_{peak1}$ is at least four times greater than the second peak amplitude $V_{peak2}$. According to at least one embodiment of the present disclosure, the first peak amplitude $V_{peak1}$ is at least five times greater than the second peak amplitude $V_{peak2}$.

According to at least one embodiment of the present disclosure, the second duration $T_2$ is at least five times longer than the first duration $T_1$. According to at least one embodiment of the present disclosure, the second duration $T_2$ is at least ten times longer than the first duration $T_1$.

According to at least one embodiment of the present disclosure, the first peak amplitude is in a range between 0.1 volts and 2 volts.

According to at least one embodiment of the present disclosure, the second peak amplitude is in a range between 0.02 volts and 1 volt.

According to at least one embodiment of the present disclosure, the first duration is in a range between 1 nanosecond and 100 nanoseconds.

According to at least one embodiment of the present disclosure, the second duration is in range between 5 nanoseconds and 1000 nanoseconds.

Figure 7:
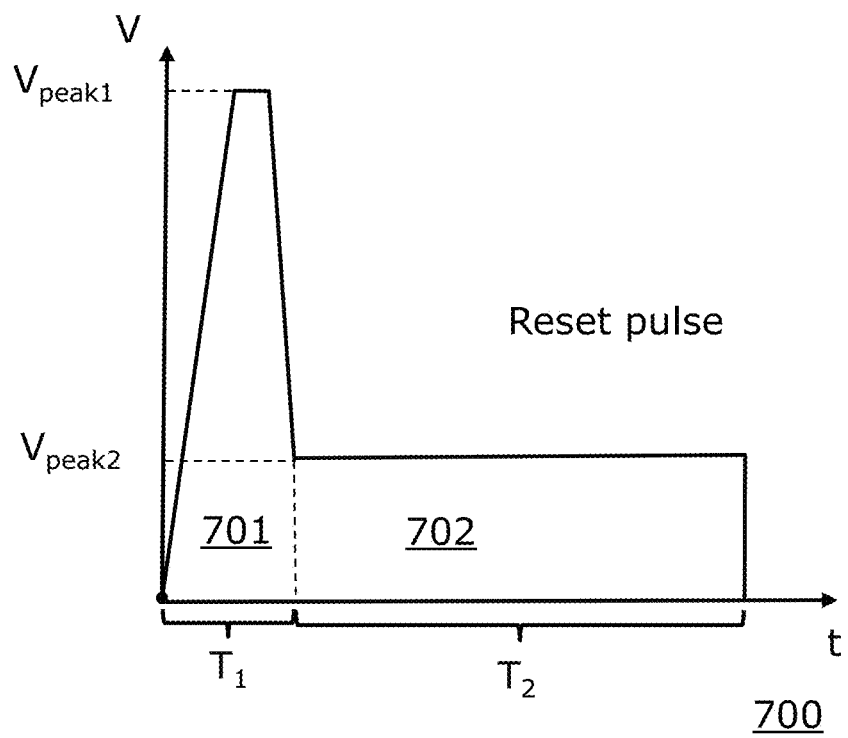
FIG. 7 depicts another illustrative reset pulse according to some embodiments of the present disclosure.

FIG. 7 depicts an exemplary reset pulse 700 according to at least one embodiment of the present disclosure. The horizontal axis indicates the time t in arbitrary units, and the vertical axis indicates the voltage V of the reset pulse 700 in arbitrary units.

The reset pulse 700 comprises a first part 701, or in other words first signal-segment 701, which extends over a first duration $T_1$, and a second part 702, or in other words second signal segment 702, which extends over a second duration $T_2$. The first part 701 is adapted to increase the temperature of the conductive filament 30 and to increase the mobility of the oxygen vacancies of the conductive filament 30. The second part 702 is configured to displace a subset of the oxygen vacancies of the conductive filament 30. More specifically, the second part 702 is configured to move the oxygen vacancies away from the terminal which acts as anode.

The first part 701 of the electrical reset pulse 700 has a first peak amplitude $V_{peak1}$, which is kept constant for a short period of time. The second part 702 of the electrical reset pulse 700 has a second peak amplitude $V_{peak2}$, which is lower than the second peak amplitude $V_{peak2}$ of the reset signal 600 (shown in FIG. 6). The lower second peak amplitude $V_{peak2}$ is compensated by a second duration $T_2$ of the reset signal 700, which is longer than the second duration $T_2$ of the reset signal 600.

It should be noted that the shapes of the reset pulses 600 and 700 as shown in FIGS. 6 and 7 are only illustrative examples, and the shape may be adapted in accordance with the needs of the respective application. According to other embodiments of the present disclosure, various other shapes may be used to reach the desired decoupling of the temperature increase and oxygen vacancy drift.

Figure 8:
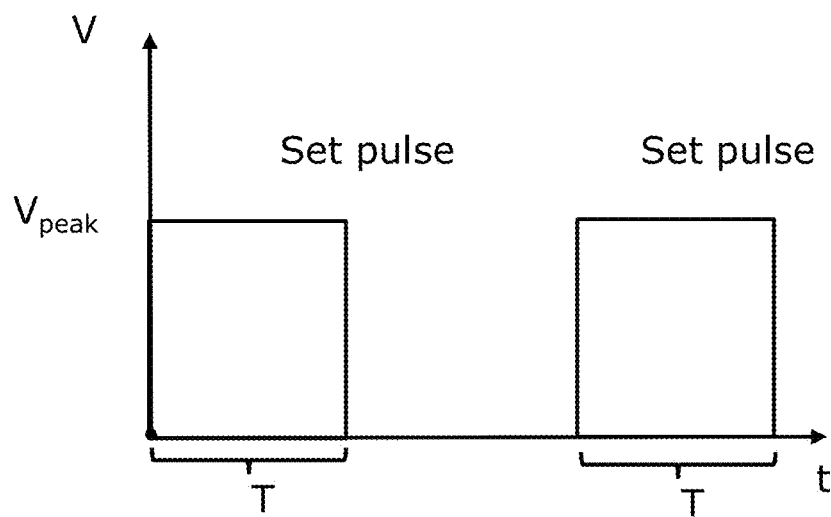
FIG. 8 depicts an example of set pulses according to some embodiments of the present disclosure.

FIG. 8 depicts an illustrative example of a signal 800 of set pulses according to an embodiment of the present disclosure. The set pulses of the signal 800 have a substantially rectangular form with a constant peak amplitude $V_{peak}$. According to at least one embodiment of the present disclosure, a programming of a desired set resistance state may include the application of multiple consecutive set pulses, such as in this example of two set pulses.

It should be noted that FIGS. 6, 7, and 8 depict illustrative examples of the absolute voltage levels of reset pulses and set pulses according to embodiments of the present disclosure. As mentioned above, the set pulses and the reset pulses have a different polarity.

According to at least one embodiment of the present disclosure, the absolute value of the peak amplitude $V_{peak}$ of the set pulses may be between the absolute value of the first peak amplitude $V_{peak1}$ and the absolute value of the second peak amplitude $V_{peak2}$ of the reset pulses.

Figure 9:
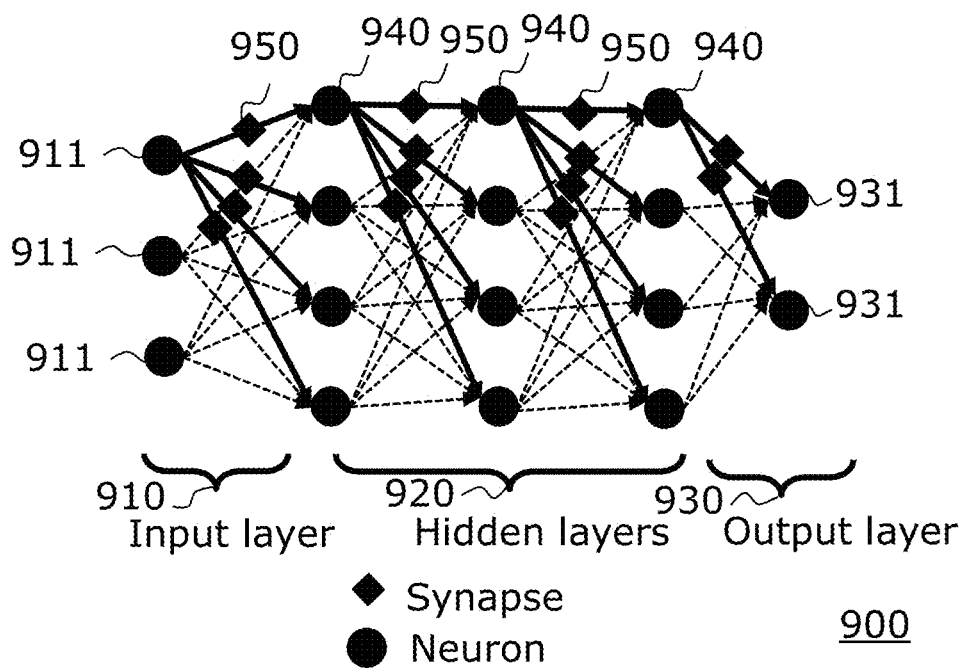
FIG. 9 depicts a neuromorphic network according to some embodiments of the present disclosure.

FIG. 9 depicts a neuromorphic network 900 according to at least one embodiment of the present disclosure. The neuromorphic network 900 comprises an input layer 910, a hidden layer 920, and an output layer 930. The input layer 910 comprises a plurality of input nodes 911, and the output layer 930 comprises a plurality of output nodes 931. The hidden layer 920 comprises a plurality of neurons 940 and a plurality of synapses 950. Each of the synapses 950 may be embodied as a resistive element, such as, for example, the resistive element 20 described above. The tunable resistive elements according to embodiments of the present disclosure are particularly suited to function as synapses in view of the bidirectional programming enabled by the specific reset pulses. Accordingly, in such an analog neuromorphic network, synapse arrays may be implemented with a single resistive element instead of two resistive elements as in previous technologies. As a result, the present disclosure facilitates higher density arrays.

Figure 10:
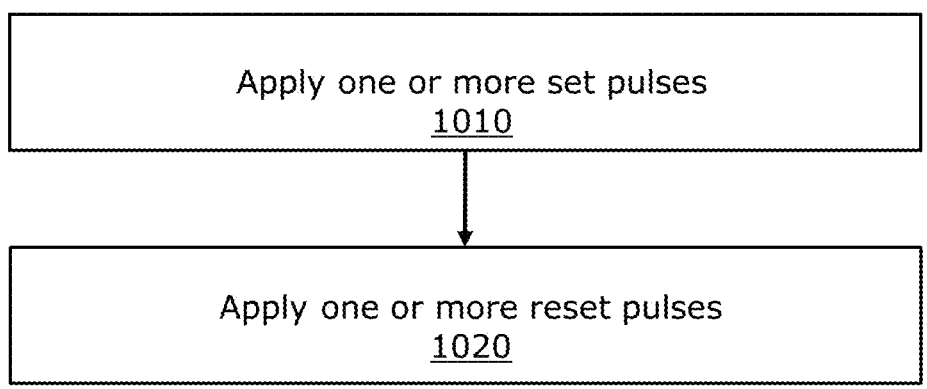
FIG. 10 depicts an illustrative flow chart of a method for programming tunable resistive elements according to some embodiments of the present disclosure.

FIG. 10 depicts an exemplary flow chart of a method 1000 for programming tunable resistive elements.

At operation 1010, the method 1000 comprises applying one or more electrical set pulses to one or more resistive elements to form a conductive filament comprising a plurality of oxygen vacancies in the dielectric layer, thereby decreasing the resistance.

At operation 1020, the method comprises applying one or more electrical reset pulses to displace a subset of the oxygen vacancies of the conductive filament, thereby increasing the resistance.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process. The modules are listed and described illustratively according to some embodiments and are not meant to indicate necessity of a particular module or exclusivity of other potential modules (or functions/purposes as applied to a specific module).

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

What is claimed is:

1. A device comprising:
at least one tunable resistive element, each tunable resistive element comprising:
a first terminal;
a second terminal; and
a dielectric layer arranged between the first terminal and the second terminal, wherein the device is configured to:
apply at least one electrical set pulse to the at least one resistive element to form a conductive filament comprising a plurality of oxygen vacancies in the dielectric layer; and
apply at least one electrical reset pulse to the at least one resistive element to displace a subset of the oxygen vacancies of the conductive filament, wherein the at least one electrical reset pulse comprises:
a first part adapted to increase the temperature of the conductive filament and to increase the mobility of the oxygen vacancies of the conductive filament; and
a second part configured to displace the subset of the oxygen vacancies of the conductive filament.

2. The device of claim 1, wherein:
the first part of the at least one electrical reset pulse has a first peak amplitude and first duration;
the second part of the at least one electrical reset pulse has a second peak amplitude and a second duration; and
the first peak amplitude is greater than the second peak amplitude and the first duration is shorter than the second duration.

3. The device of claim 2, wherein:
the first peak amplitude is at least two times greater than the second peak amplitude.

4. The device of claim 2, wherein:
the second duration is at least five times longer than the first duration.

5. The device of claim 2, wherein:
the first peak amplitude is in a range between 0.1 volts and 2 volts;
the second peak amplitude is in a range between 0.02 volts and 1 volt;
the first duration is in a range between 1 nanosecond and 100 nanoseconds; and
the second duration is a range between 5 nanoseconds and 1000 nanoseconds.

6. The device of claim 1, wherein the at least one tunable resistive element is configured to:
provide a plurality of set resistance states in response to an application of at least one electrical set pulse; and
provide a plurality of reset resistance states in response to an application of at least one electrical reset pulse.

7. The device of claim 1, wherein the dielectric layer comprises a metal-oxide material.

8. The device of claim 7, wherein the metal-oxide material is a transition metal-oxide.

9. The device of claim 8, wherein the metal-oxide material is a perovskite transition metal-oxide.

10. The device of claim 7, wherein the metal-oxide material is selected from the group consisting of:
$ABO_{3-\delta}$ perovskites, A being an alkaline earth element, a rare earth element, or a combination thereof, and B being a transition-metal element;
lanthanum and/or strontium titanium oxide $(La,Sr)TiO_{3-\delta}$;
yttrium and/or calcium titanium oxide $(Y,Ca)TiO_{3-\delta}$;
lanthanum and/or strontium manganese oxide $(La,Sr)MnO_{3-\delta}$;
praseodymium and/or calcium manganese oxide $(Pr,Ca)MnO_{3-\delta}$;
calcium manganese oxide $(Pr,Ca)MnO_{3-\delta}$;
corundum;
vanadium and/or chromium oxide $(V,Cr)_2O_{3-\delta}$;
binary transition metal-oxides;
nickel oxide $NiO_{1-\delta}$;
titanium oxide $TiO_{2-\delta}$;
hafnium and/or zirconium oxide $(Hf,Zr)O_{2-\delta}$; and
cerium oxide $CeO_{2-\delta}$.

11. The device of claim 1, wherein at least one of the first terminal and the second terminal comprises one of a metal, a metal-oxide, conductive carbon, and amorphous carbon.

12. The device of claim 11, wherein at least one of the first terminal and the second terminal comprises a material selected from the group consisting of: Ti, TiN, Ta, TaN, W, Cu, Pt, and any metallic oxide such as WO3, RuO2, and ITO.

13. The device of claim 1, wherein the dielectric layer has a thickness between 1 nanometer and 50 nanometers.

14. The device of claim 1, wherein the device is configured to provide a bidirectional resistance curve upon an application of set pulses and reset pulses.

15. The device of claim 1, wherein the device comprises a control unit for applying the electrical set pulses and the electrical reset pulses as electrical programming pulses to at least one of the first terminal and the second terminal.

16. The device of claim 15, wherein the control unit is configured to program the resistance state of the resistive elements by an iterative program and verify procedure.

17. The device of claim 15, wherein the control unit is configured to apply:
in a read mode, a read voltage to the first terminal and the second terminal for reading the resistance state of the one or more resistive elements.

18. The device of claim 1, wherein the device is configured as a synapse for a neuromorphic network.

19. A method for programming a tunable resistive element, the tunable resistive element comprising a first terminal, a second terminal, and a dielectric layer between the first terminal and the second terminal, the method comprising:
applying at least one electrical set pulse to the tunable resistive element to form a conductive filament comprising a plurality of oxygen vacancies in the dielectric layer; and
applying at least one electrical reset pulse to displace a subset of the oxygen vacancies of the conductive filament, the at least one electrical reset pulse comprising:
a first part adapted to increase the temperature of the conductive filament and to increase the mobility of the oxygen vacancies of the conductive filament; and
a second part configured to displace the subset of the oxygen vacancies of the conductive filament.

20. A computer program product for operating a device comprising at least one tunable resistive element, wherein each tunable resistive element comprises a first terminal, a second terminal, and a dielectric layer arranged between the first terminal and the second terminal, the computer program product comprising a non-transitory computer readable storage medium having program instructions embodied therewith, the program instructions executable by a control unit to cause the control unit to perform a method, the method comprising:

applying at least one electrical set pulse to the at least one resistive element to form a conductive filament comprising a plurality of oxygen vacancies in the dielectric layer; and applying at least one electrical reset pulse to displace a subset of the oxygen vacancies of the conductive filament, the at least one electrical reset pulse comprising:

a first part adapted to increase the temperature of the conductive filament and to increase the mobility of the oxygen vacancies of the conductive filament; and a second part configured to displace the subset of the oxygen vacancies of the conductive filament.

* * * * *